United States Patent [19]

Nakagawa

[11] Patent Number: 5,100,726

[45] Date of Patent: Mar. 31, 1992

[54] MATERIAL FOR A HOUSING FOR SHIELDING ELECTRONIC COMPONENTS FROM ELECTROMAGNETIC NOISE

[75] Inventor: Asaharu Nakagawa, Yokkaichi, Japan

[73] Assignee: Kitagawa Industries Co., Ltd., Aichi, Japan

[21] Appl. No.: 427,524

[22] Filed: Oct. 27, 1989

[30] Foreign Application Priority Data

Nov. 4, 1988 [JP]  Japan ................................. 63-280121

[51] Int. Cl.⁵ .......................... B32B 5/12; B32B 15/08
[52] U.S. Cl. .................................... 428/323; 428/457; 428/458; 428/461
[58] Field of Search .............. 428/457, 458, 323, 461; 252/511; 174/35 MS FIle; 523/137

[56] References Cited

U.S. PATENT DOCUMENTS

| | | | |
|---|---|---|---|
| 4,404,125 | 9/1983 | Abolins et al. | 252/511 |
| 4,602,051 | 7/1986 | Nabeta et al. | 523/137 |
| 4,816,184 | 3/1989 | Fukuda et al. | 252/511 |
| 4,916,016 | 4/1990 | Bristowe et al. | 428/458 X |
| 4,960,643 | 10/1990 | Lemelson | 428/408 |

FOREIGN PATENT DOCUMENTS

| | | |
|---|---|---|
| 61-14917 | 1/1986 | Japan . |
| 63-10599 | 1/1988 | Japan . |
| 62-202093 | 8/1988 | Japan . |
| 1-138234 | 5/1989 | Japan . |
| 1283916 | 8/1972 | United Kingdom . |
| 2020699A | 11/1979 | United Kingdom . |
| 2166666A | 5/1986 | United Kingdom . |
| 8602882 | 11/1985 | World Int. Prop. O. . |

OTHER PUBLICATIONS

Examiner's Report to the Comptroller Under Section 17, Examiner M. J. Insley, Jan. 29, 1990, application No. 8924854.6.

Primary Examiner—Thomas J. Herbert, Jr.
Attorney, Agent, or Firm—Oliff & Berridge

[57] ABSTRACT

A layered material for a housing that shields electronic components, comprising synthetic resin body reinforced with carbon fiber, which has superior mechanical properties and conductivity, and a metallic layer on its surface made of metal with high permeability, is light and endowed with high conductivity and high permeability wherein the housing prevents electromagnetic troubles of electronic components by concentrating magnetic flux from low-frequency magnetic field on the ferromagnetic layer spread on its outer surface.

10 Claims, No Drawings

MATERIAL FOR A HOUSING FOR SHIELDING ELECTRONIC COMPONENTS FROM ELECTROMAGNETIC NOISE

BACKGROUND OF THE INVENTION

This invention relates to a material for a housing for shielding electronic components from external electromagnetic noise.

In recent years, digital apparatus, including microcomputers, have been developing remarkably and are used widely in office equipment, household electric appliances, automobiles, etc. In addition, microcomputers with higher integration and higher clock frequency have been increasing in number. In some cases, however, electromagnetic wave noise generated in electronic components, or the like, is carried away on signal conductors, such as flat cables, or directly affects the electronic components. Such electromagnetic wave noise brings about breakdowns, troubles, and faulty operations of the electronic components controlled and driven by weak electric current. Moreover, data recorded in highly dense recording elements of electronic components is extinguished by external magnetic fields caused by magnets, or the like, because the magnetic recording elements are made of magnetic substance with small magnetic energy.

In order to prevent these electromagnetic troubles, prior-art conductive metallic housings, such as iron housings, or synthetic resin housings containing carbon black particles as conductive filler, are utilized to shield electronic components from external electromagnetic noise.

However, each type of these housings for shielding electronic components from electromagnetic noise is imperfect and has problems.

Synthetic resin containing carbon black particles can form a light housing for shielding electronics (referred to as "C.B. resin housing"). Yet, a housing must be strong enough to house electronic components and resist external force. The housing can contain only limited carbon black particles, because the more carbon black particles contained in the synthetic resin, the weaker the synthetic resin base material becomes. Therefore, the electric resistivity given by the carbon black particles may be decreased to about 100 ohm.cm at the best, which is insufficient to shield electronic components from electromagnetic noise. In addition, since the C.B. resin is a non-magnetic substance, magnets must be attached on the outer surface of the housing. The magnets cannot shield electronics from low-frequency magnetic field perfectly, and breakdowns, faulty operations, or the like, of the electronic components are brought out.

The other prior-art housing made of iron for shielding electromagnetics (referred to as "iron housing") is bestowed with high permeability and high conductivity, or low electric resistivity of about $10^{-5}$ ohm.cm. Hence, the iron housing can prevent breakdowns or faulty operations of the electronic components by concentrating the magnetic flux of an external low-frequency magnetic field on its surface and shielding electromagnetic wave noise generated by the electronic components. However, the iron housing must be thick enough to maintain designated strength and is thus very heavy.

SUMMARY OF THE INVENTION

It is an object of this invention to provide a light housing for protecting electronic components from electromagnetic troubles caused by electromagnetic wave noise or external low-frequency magnetic field.

The object is realized by a housing for shielding electromagnetics, comprising a synthetic resin body containing carbon fiber that is made of hydrocarbon by pyrolytic vapor phase system and has nuclei of hyperfine powder of high-melting metal and/or its compound, and a layer on its surface made of a metal with high permeability, or its compound.

DETAILED DESCRIPTION OF PREFERRED EMBODIMENTS

A housing for shielding electronic components from electromagnetic noise (referred to as "housing") is provided with a highly permeable metallic layer on its surface, and a body made of synthetic resin compound, such as polyester resin, vinyl resin, or polyamide resin, which is reinforced with carbon fiber.

The carbon fiber is, unlike polyacrylonitrile carbon fiber or pitch carbon fiber, similar to whiskers in shape, and has a micro diameter almost the same as that of hyperfine powder of high-melting metal and/or its compound. The housing can uniformly reduce permeating electromagnetic waves, because the carbon fiber is easily adhered to and evenly dispersed and kept all over the synthetic resin. The carbon fiber based on graphite crystal layers with regular lattices is endowed with the lowest electric resistivity, or the highest conductivity, among all kinds of carbon fiber and also with desirable mechanical properties, such as tensile strength, which are peculiar to carbon fiber. Therefore, the carbon fiber, dispersed and kept in the synthetic resin, improves both the conductivity and the mechanical properties of the synthetic resin. The housing with conductivity brought by the carbon fiber can shield the electronic components from electromagnetic wave noise by reflecting noise from the outside and absorbing noise generated by the electronic components.

The conductivity or electric resistivity of the housing depends on the content of the carbon fiber. When the carbon fiber content increases to a designated amount sufficient to keep the carbon fibers in touch with one another, the electric resistivity of the housing is almost the same as that of the carbon fiber alone. The designated amount is between approximately 30% by volume and approximately 50% by volume of the synthetic resin. The appropriate content for decreasing the electric resistivity is above 20% by volume of the synthetic resin.

High-melting metals used to create carbon fiber of this invention must not evaporate at between 950° C. and 1300° C., where the hydrocarbon is pyrolized. The usable metals are Ti and Zr in 4a group, V and Nb in 5a group, Cr and Mo in 6a group, Mn in 7a group, and Fe and Co in 8 group, in a periodic table. Fe, Co, Ni, V, Nb, Ta, Ti, and Zr are most preferable. Compounds of these metals include their oxides, nitrides, and salts.

The housing has any shape, such as a box, or a cylinder. Synthetic carbon fiber is formed into a housing by injection molding, vacuum molding, or the like.

The layer made of metal with high permeability or its compound shields the interior of the housing from the external magnetic field. Any metal including Fe, Co, and Ni, its compound, or any ferrite, is utilized for the metallic layer. The metallic layer is formed on either side or both sides of the wall surface of the housing by means of vacuum deposition, electroless plating, or coating. Ordinary electrolytic coating is available because the housing is conductive.

EXPERIMENT

Table 1 shows measured values of properties, such as electric resistivity or density, of a housing of this invention and of a prior-art housing. The housing of this invention is made of ABS resin containing carbon fiber of diameter between 0.1 μm and 0.5 μm and of length between 0.1 mm and 1 mm, and a nickel layer of thickness of 0.02 mm. The carbon fiber is created in a furnace between 950° C. and 1300° C. by vapor phase system, where benzene is pyrolized, and has nuclei of iron powder of grain diameter between 0.02 μm and 0.03 μm. On the other hand, the prior-art housing is made of ABS resin containing carbon black particles. Test piece No. 1 described in JIS (Japanese Industrial Standard) is utilized. ABS resin, carbon fiber, and carbon black particles are mixed to have the composition ratio below.

INVENTION A
 ABS resin : 65 volume percentage
 Carbon fiber : 35 volume percentage
INVENTION B
 ABS resin : 80 volume percentage
 Carbon fiber : 20 volume percentage
COMPARISON C
 ABS resin : 70 volume percentage
 Carbon black particles : 30 volume percentage more effective housing for shielding electronic equipment from electromagnetic noise. In addition, metallic layers formed on both sides of the wall of the housing can shield electronic components from external magnetic field.

What is claimed is:

1. A material for a housing that shields electronic components from electric noise comprising:
 a base material of synthetic resin; carbon fibers dispersed in the base material, said carbon fibers consisting essentially of carbon and being made by pyrolyzing at least one hydrocarbon in a vapor phase system, said carbon fibers having a diameter between 0.1 microns and 0.5 microns and a length between 0.1 millimeter and 1.0 millimeter; and
 a metallic layer formed on at least a first surface of the base material.

2. The material of claim 1, wherein between 20% and 50% by volume of carbon fibers are dispersed in the base material.

3. The housing material of claim 1, wherein the synthetic resin is chosen from the group consisting of polyester resin, vinyl resin, and polyamide resin.

4. The housing material of claim 1, wherein the metallic layer is formed from a metal chosen from the group of metals consisting of iron (Fe), copper (Cu), and nickel (Ni).

5. The housing material of claim 1, wherein the metallic layer is formed on the first surface of the base material by vacuum deposition.

6. The housing material of claim 1, wherein the metal-

TABLE 1

| | COMPOSITION RATIO *1 (VOLUME %) | VOLUME RESISTIVITY (ohm · cm) | DENSITY (kg/cm$^2$) | SHIELDING EFFECT (dB) *2 | |
|---|---|---|---|---|---|
| | | | | ELECTRIC FIELD | MAGNETIC FIELD |
| INVENTION A | 35 | $4 \times 10^{-2}$ | 1.19 | 45 | 10 |
| INVENTION B | 20 | $8 \times 10^{-1}$ | 1.13 | 20 | 6 |
| COMPARISON C | 30 | 5 | 1.02 | 30 | BELOW 5 |

*1 COMPOSITION RATIO OF CARBON FIBER OR CARBON BLACK PARTICLES
*2 SHIELDING EFFECT IN ELECTRIC FIELD OF 500 MHz OR MAGNETIC FIELD OF 10 KHz

As seen from the result of the experiment, the housing of this invention has superior mechanical properties and conductivity to and also is as light as the prior-art housing (Comparison C). Furthermore, the housing can shield low-frequency magnetic fields, which the prior-art housing cannot shield, because the surface of this invention is covered with a nickel layer.

As the carbon fiber is contained in the synthetic resin above 20% by volume, the lattices of the carbon fiber become smaller and smaller, because the carbon fibers link and intersect with one another more and more frequently. Therefore, synthetic resin, containing carbon fiber above 20% by volume in accordance with frequency of electromagnetic noise generated, can form lic layer is formed on the first surface of the base material by coating.

7. The housing material of claim 1, wherein the metallic layer is formed on the first surface of the base material by electrolysis.

8. The housing material of claim 1, wherein the metallic layer is formed on the first surface of the base material by electroless plating.

9. The housing material of claim 1, wherein a metallic layer is formed on a second surface of the base material.

10. The housing material of claim 1, wherein the carbon fibers are whisker shaped.

* * * * *

UNITED STATES PATENT AND TRADEMARK OFFICE
CERTIFICATE OF CORRECTION

PATENT NO. : 5,100,726
DATED : March 31, 1992
INVENTOR(S) : Asaharu NAKAGAWA et al.

It is certified that error appears in the above-identified patent and that said Letters Patent is hereby corrected as shown below:

ON THE TITLE PAGE

Item [19], "Nakagawa" to --Nakagawa et al--;

line 75, after "Japan", insert --Morinobu Endo, Suzaka, Japan--.

Signed and Sealed this

Eighth Day of June, 1993

Attest:

Attesting Officer

MICHAEL K. KIRK

Acting Commissioner of Patents and Trademarks